(12) United States Patent
Shi et al.

(10) Patent No.: US 8,050,025 B2
(45) Date of Patent: Nov. 1, 2011

(54) COVER MECHANISM AND ELECTRONIC DEVICE USING SAME

(75) Inventors: Zheng Shi, Shenzhen (CN); Chih-Chiang Chang, Taipei Hsien (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 570 days.

(21) Appl. No.: 12/212,748

(22) Filed: Sep. 18, 2008

(65) Prior Publication Data

US 2009/0225520 A1    Sep. 10, 2009

(30) Foreign Application Priority Data

Mar. 6, 2008 (CN) .......................... 2008 1 0300485

(51) Int. Cl.
*G06F 1/16* (2006.01)

(52) U.S. Cl. ................ 361/679.33; 455/575.8; 292/216; 132/295

(58) Field of Classification Search ............... 455/575.1, 455/575.8, 550.1; 292/216; 361/679.31, 361/679.32, 679.33; 132/294, 295
See application file for complete search history.

(56) References Cited

U.S. PATENT DOCUMENTS

| 5,663,867 A * | 9/1997 | Honda et al. ............. 361/679.32 |
| 7,647,079 B2 * | 1/2010 | Zuo et al. .................... 455/575.1 |
| 2008/0122229 A1 * | 5/2008 | Choi et al. .................... 292/216 |

FOREIGN PATENT DOCUMENTS

CN    1893445 A    1/2007

* cited by examiner

*Primary Examiner* — Hung Duong
(74) *Attorney, Agent, or Firm* — Altis Law Group, Inc.

(57) ABSTRACT

A portable electronic (200) device using a cover mechanism (100) to close off two or more interface holes (3512, 3522 and 353) is described. The portable electronic device includes a base portion (30). The cover mechanism includes a first cover member (50) and a second cover member (70). The first cover member has a first cover portion (51) to close off one or more interface holes. The second cover member has a second cover portion (71) to close off another one or more interface holes. The second cover member is latched to the base, and the first cover member is latched to the base and the second cover member.

16 Claims, 6 Drawing Sheets

COVER MECHANISM AND ELECTRONIC DEVICE USING SAME

BACKGROUND

1. Field of the Invention

The exemplary invention relates to cover mechanisms used in electronic devices.

2. Description of Related Art

Electronic devices usually have external interfaces for electrically connecting peripheral devices, accessories or networks to the electronic device. Such external interfaces should be protected by the cover mechanisms for continued proper functioning.

Cover mechanisms usually include covers with locks. When the cover mechanisms are used in electronic devices (e.g., mobile phones), the covers are typically locked to the electronic devices by the locking means and, used to cover holes through which the interfaces (e.g., universal serial bus (USB)) of electronic devices are exposed. However, it can be difficult to close off two or more interfaces with one cover mechanism.

Therefore, there is room for improvement within the art.

BRIEF DESCRIPTION OF THE DRAWINGS

Many aspects of the exemplary cover mechanism and a portable electronic device using the cover mechanism can be better understood with reference to the following drawings. These drawings are not necessarily drawn to scale, the emphasis instead being placed upon clearly illustrating the principles of the exemplary cover mechanism and the portable electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EMBODIMENTS

Figure 1:
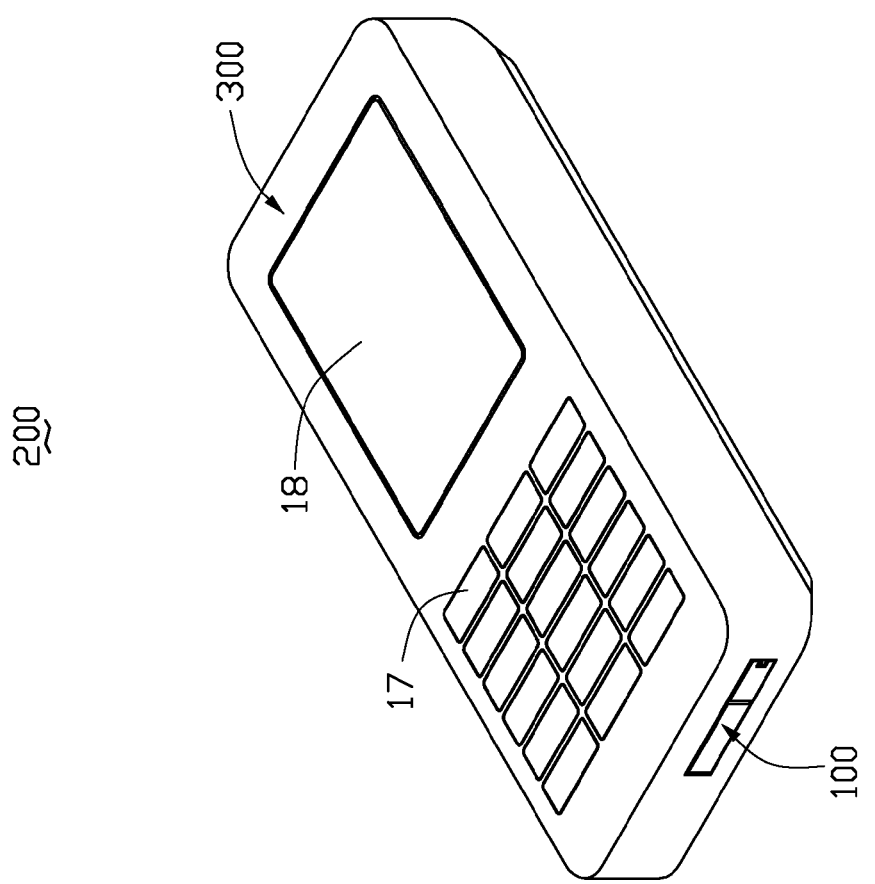
FIG. 1 is an isometric view of an electronic device including an cover mechanism according to an exemplary embodiment.

Referring to FIG. 1, an exemplary mobile phone 200 can be seen including an enclosed housing 300, a keypad 17, a display 18, and a cover mechanism 100.

Figure 2:
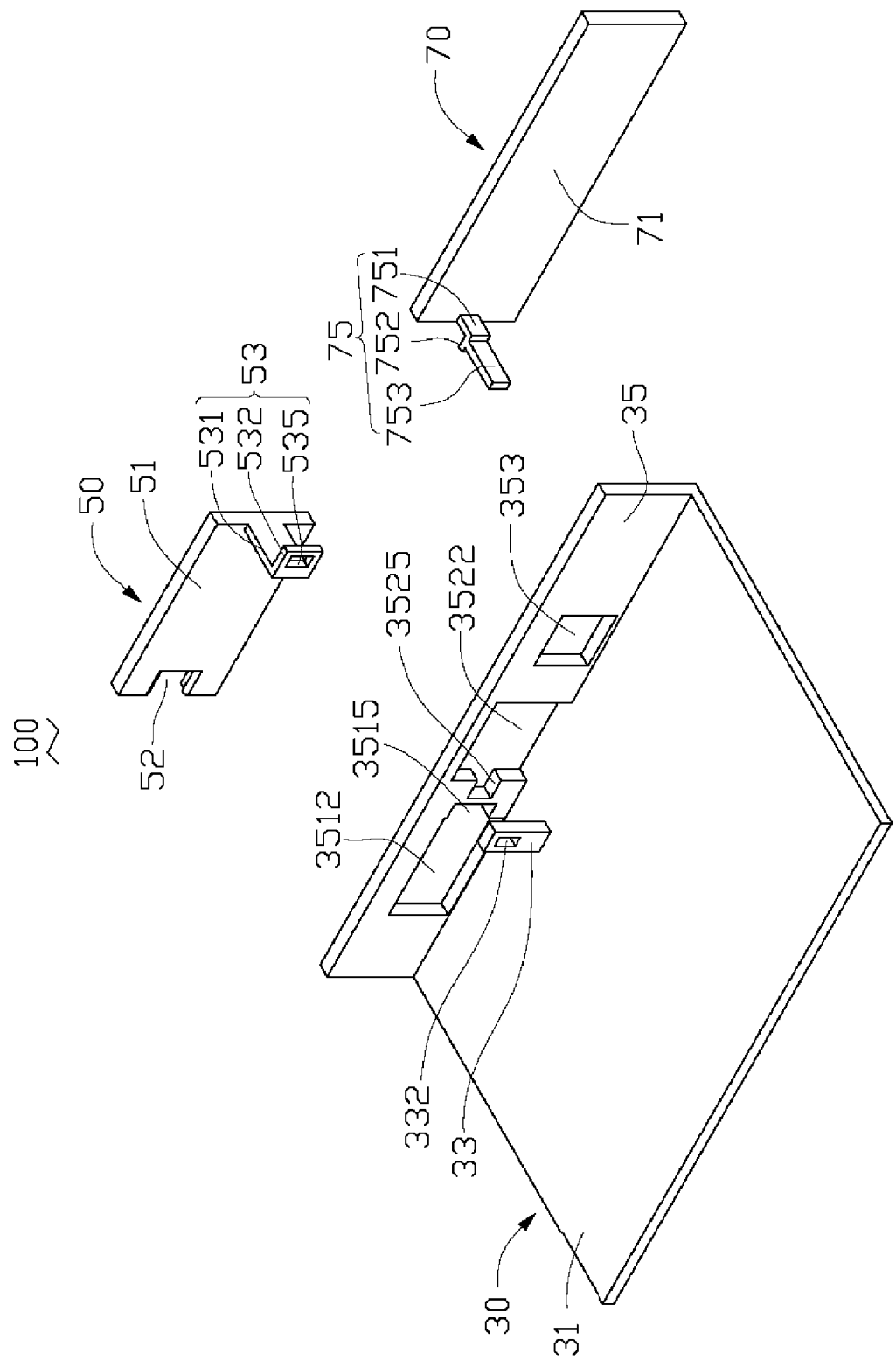
FIG. 2 is an exploded and isometric view of the cover mechanism shown in FIG. 1.

Referring to FIG. 2, the cover mechanism 100 includes a base portion 30, i.e., parts of the housing 300 (e.g. a bottom wall 31 and a sidewall 35), a first cover member 50 and a second cover member 70. The cover mechanism 100 is used to close off three interface holes defined in sidewall 35, which are illustrated and identified as a first interface hole 3512, a second interface hole 3522 and a third interface hole 353. The second interface hole 3522 is positioned between the first interface hole 3512 and the third interface hole 353. A portion of the sidewall 35 between the first interface hole 3512 and the second interface hole 3522 defines a groove 3515 and a slit 3525 therethrough. The groove 3515 and the slit 3525 communicate with the first interface hole 3512 and the second interface hole 3522, respectively. The bottom wall 31 has a locking block 33 protruding therefrom and adjacent to the slit 3525. The locking block 33 is generally rectangular and has a first locking hole 332 aligning with the slit 3525.

Figure 3:
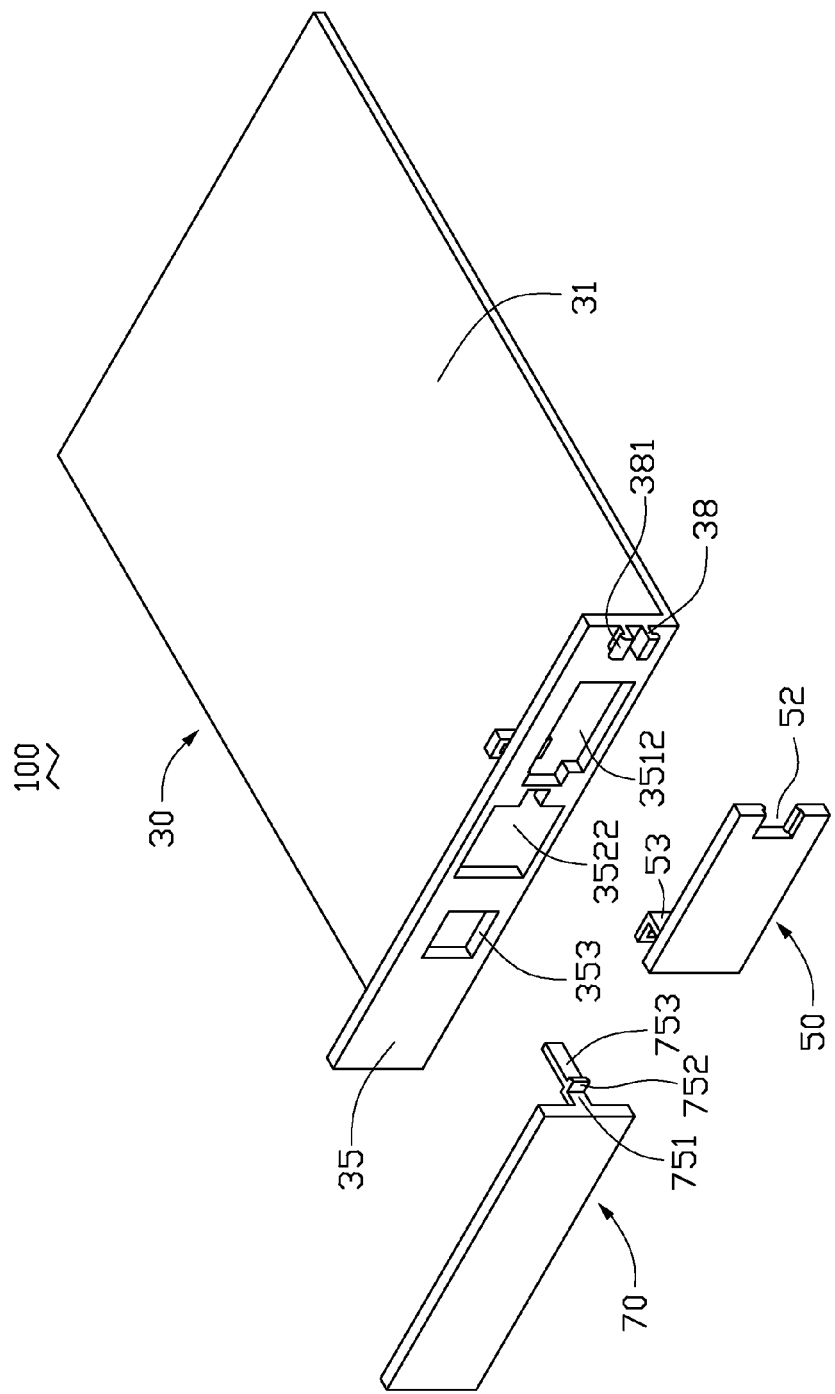
FIG. 3 is similar to FIG. 2, showing another aspect thereof.

Referring to FIG. 3, the sidewall 35 has two latching protrusions 38 protruding from an outside surface thereof. The two latching protrusions 38 are adjacent to the first interface hole 3512 and on the side of the first interface hole 3512 opposite to second interface hole 3522. Each of the latching protrusions 38 is generally L-shaped having a latching end 381 extending therefrom. The latching ends 381 extend in opposite directions.

The first cover member 50 has a first cover portion 51, a latching cutout 52 and a locking protrusion 53. The latching cutout 52 and the locking protrusion 53 are located at opposite ends of the first cover member 50, respectively. The first cover portion 51 is flexible (e.g. flexible rubber) and disposed between the latching cutout 52 and the locking protrusion 53. The first cover portion 51 is configured to cover the first interface 3512 (best shown in FIG. 4).

The latching cutout 52 is configured for receiving and latching the latching protrusions 38 therein. Accordingly, an interior wall of the latching cutout 52 is configured for receiving and latching the two latching ends 381 therein. The locking protrusion 53 is generally L-shaped and includes a first connecting portion 531 and a locking portion 532. The first connecting portion 531 connects the locking portion 532 to the first cover portion 51. The first connecting portion 531 is configured for inserting into the groove 3515. The locking portion 532 defines a second locking hole 535 corresponding to the first locking hole 332.

The second cover member 70 has a second cover portion 71 and a locking pin 75 protruding from a surface of the second cover portion 71. The second cover portion 71 is configured to cover the second interface hole 3522 and the third interface hole 353 (best shown in FIG. 4). The second cover portion 71 is also flexible (e.g. flexible rubber). The locking pin 75 is at one end of the second cover portion 71 and includes a second connecting portion 751, a limiting portion 752 and a pin portion 753. The limiting portion 752 connects the second connecting portion 751 and the pin portion 753.

The second connecting portion 751 connects the limiting portion 752 and the pin portion 753 to the second cover portion 71. The second connecting portion 751 can be received in the slit 3525 when the second cover member 70 engages to the sidewall 35. At this position, the limiting portion 752 is configured for locking with a part of the sidewall 35 between the groove 3515 and the slit 3525 to prevent the second cover member 70 from moving away in a vertical direction (best shown in FIG. 4). The pin portion 753 is configured for locking into the first locking hole 332 and thus prevent second cover member 70 from moving away in a horizontal direction (best shown in FIG. 4). The pin portion 753 has substantially the same size and shape as first locking hole 332.

Figure 4:
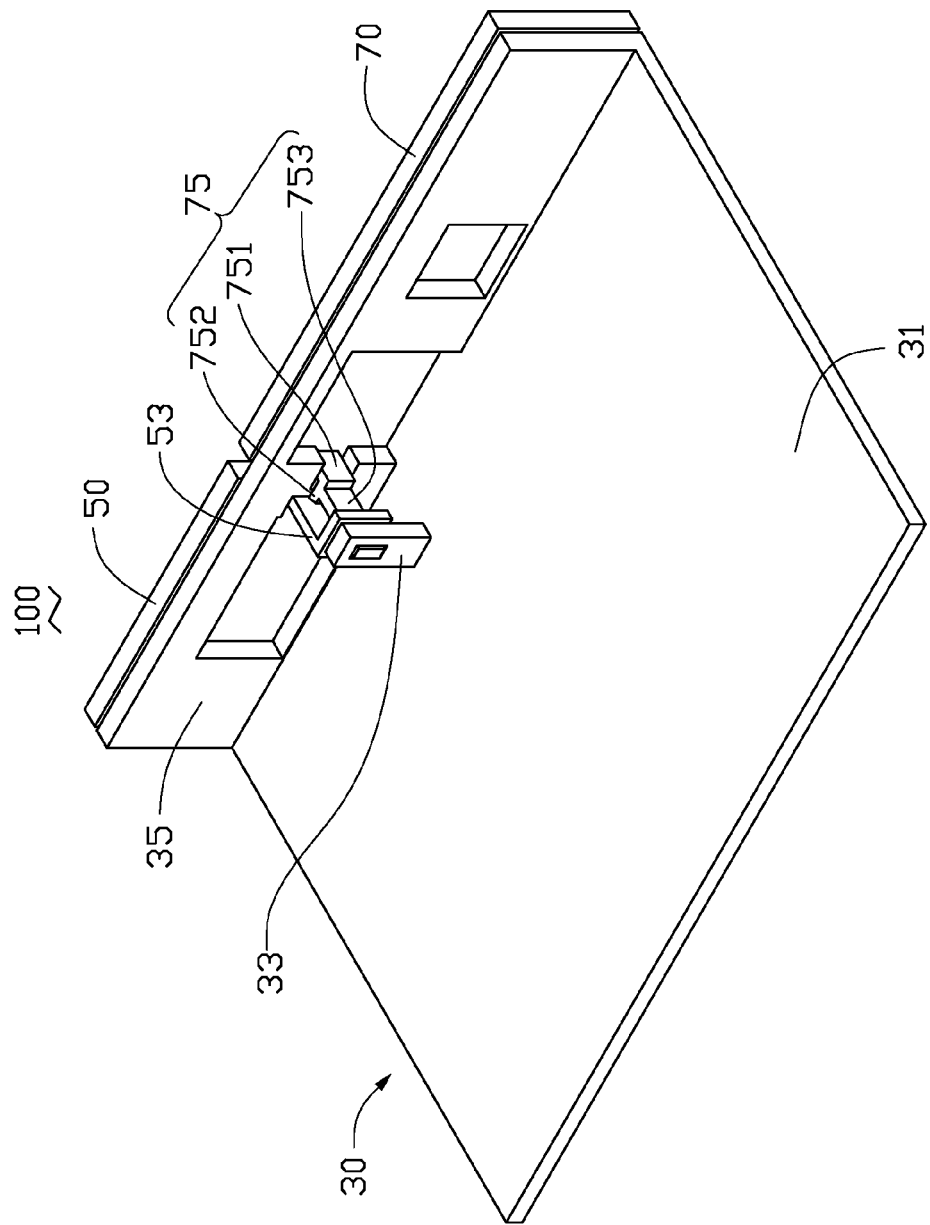
FIG. 4 is an assembled view of the cover mechanism shown in FIG. 2.
Figure 5:
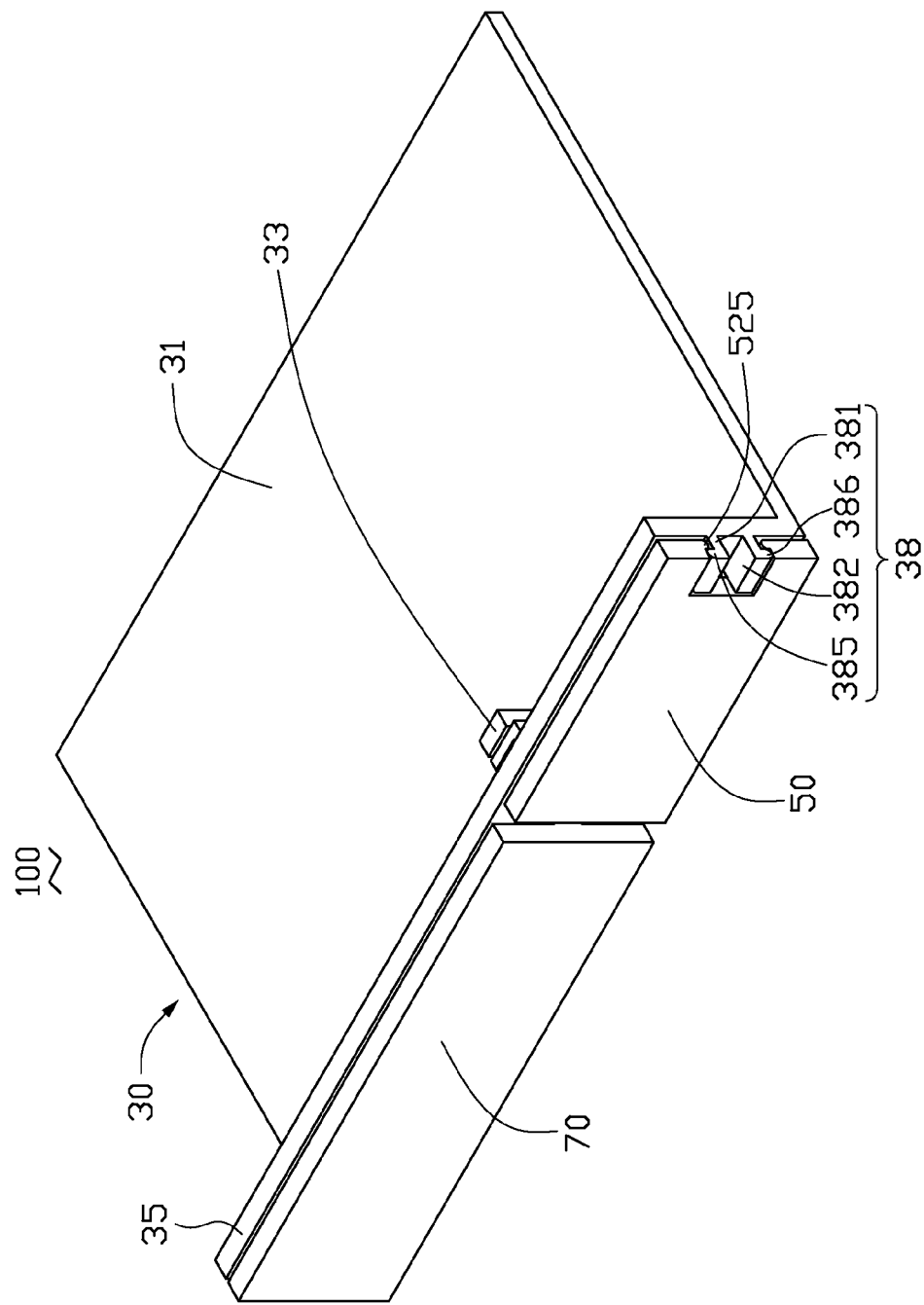
FIG. 5 is similar to FIG. 4, showing another aspect thereof.

Referring to FIGS. 4 and 5, the first cover member 50 is locked to the base 30 by latching two latching protrusions 38 into the latching cutout 52. At this time, the locking portion 532 contacts the locking block 33 and located between the locking block 33 and the groove 3515. The second locking hole 535 aligns with the first locking hole 332. Then, the second cover member 70 is locked to the base 30 after the pin portion 753 inserts into the first locking hole 332 and the second locking hole 535. When the latching protrusions 38 are in the latching cutout 52, the first cover member 50 cannot move away from the sidewall 35 in a vertical direction. Also, by a locking of the pin portion 753 into the second locking hole 535, the first cover member 50 cannot move away from the sidewall 35 in a horizontal direction. The vertical movement is stopped by the locking of the limiting portion 752 against the part of the sidewall 35 between the groove 3515 and the slit 3525. The horizontal movement is limited by the locking of the pin portion 753 into the first locking hole 332. The first cover portion 51 closes off the first interface hole 3512, simultaneously, the second cover portion 71 closes off the second and third interface holes 3522 and 353. Therefore, the cover mechanism 100 closes off two or more interface holes, exemplified as the first, second and third interfaces holes 3512, 3522 and 353.

Figure 6:
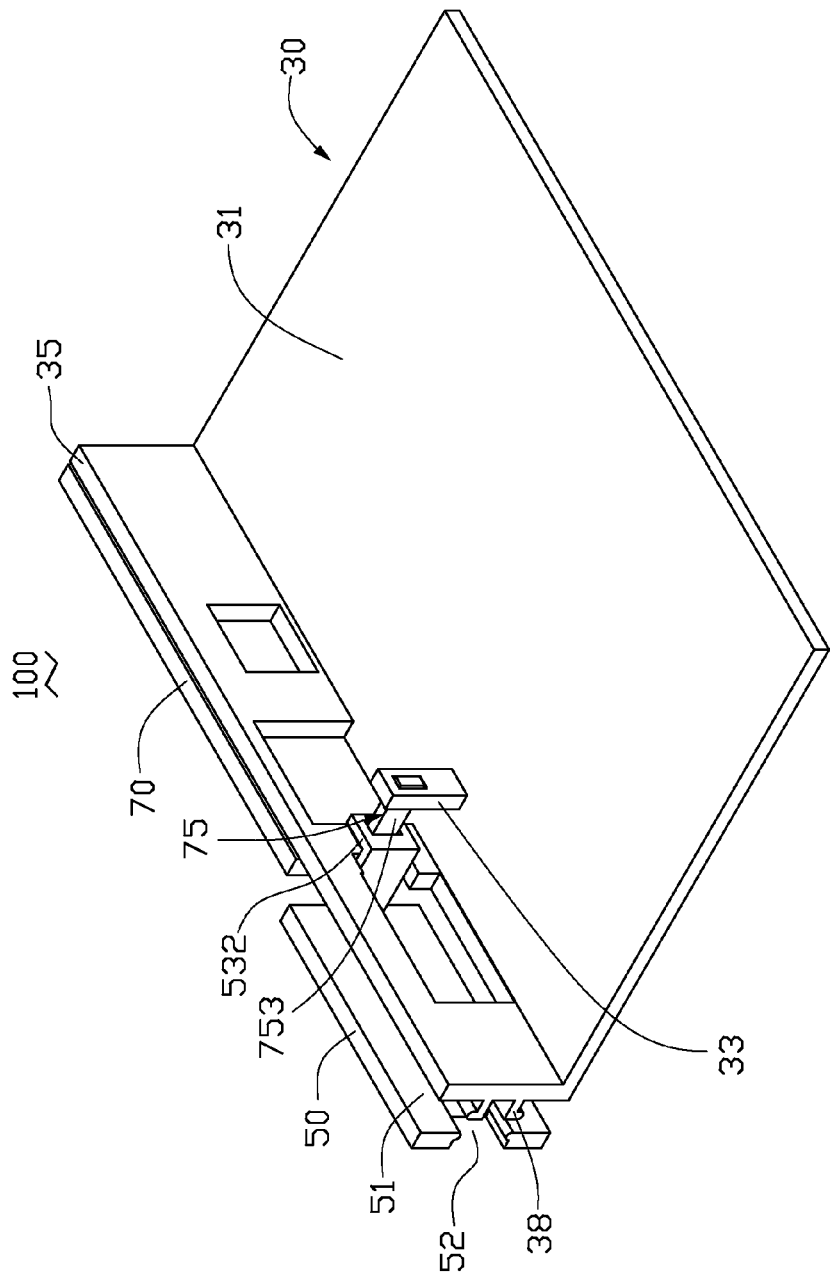
FIG. 6 is similar to FIGS. 4 and 5, both being viewed from different angle and showing an opening operation of the cover mechanism.

Referring to FIG. 6, when the first interface hole 3512 needs to be exposed, the first cover member 50 will be released from the locked state. During this stage, the first cover member 50 is pulled away enabling the two latching protrusions 38 to disengage from the latching cutout 52. Because the first cover portion 51 is flexible and the pin portion 753 being locked into the second locking hole 535, the first interface hole 3512 can be exposed by bending the first cover portion 51 around the locking portion 532.

When the second and third interface holes 3522 and 353 need to be exposed, the second cover member 70 will be released from the locked state. Because the second cover portion 71 is flexible, the second and third interface holes 3522 and 353 can be exposed by bending the second cover portion 71 around the locking pin 75.

It is to be understood, however, that even through numerous characteristics and advantages of the exemplary invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cover mechanism for closing off two or more connector holes of a portable electronic device including a base portion, the cover mechanism comprising:
    a flexible first cover member comprising a flexible first cover portion that can be bent to expose or cover at least one interface hole; and
    a flexible second cover member comprising a flexible second cover portion that can be bent to expose or cover at least another interface holes;
    wherein the flexible second cover member is latched to the base portion, and the flexible first cover member is latched to the base portion and the flexible second cover member.

2. The cover mechanism as claimed in claim 1, wherein the flexible first cover member is latched to the base portion so that the flexible first cover member is stopped from moving away from the base portion in a first direction, and the flexible first cover member is latched to the flexible second cover member so that the flexible first cover member is stopped from moving away from the base portion in a second direction.

3. The cover mechanism as claimed in claim 2, wherein the flexible first cover member further comprises a latching cutout, the base portion comprising a latching protrusion latched into the latching cutout.

4. The cover mechanism as claimed in claim 2, wherein:
    the base portion comprises a locking block defining a first locking hole; and
    the flexible first cover member further comprises a locking protrusion defining a second locking hole;
    wherein when the flexible first cover member is latched to the base portion, the first locking hole aligns with the second locking hole, and the locking protrusion contacts the locking block.

5. The cover mechanism as claimed in claim 4, wherein the flexible second cover member further comprises a locking pin comprising a limiting portion and a pin portion;
    when the flexible second cover member is latched to the base portion and the flexible first cover member, the limiting portion resists against base portion and thus limits the flexible second cover member from moving in a first direction, and the pin portion engages through the first and second locking holes and thus limits the flexible second cover member from moving in a second direction.

6. The cover mechanism as claimed in claim 5, wherein the flexible first cover member is configured to be biased around the locking protrusion, and the flexible second cover member is configured to be biased around the locking pin.

7. A portable electronic device, comprising:
    a base;
    two or more interface holes;
    a cover mechanism configured for closing off the interface holes, comprising:
    a flexible first cover member comprising a flexible first cover portion that can be bent to expose or cover one or more interface holes; and
    a flexible second cover member comprising a flexible second cover portion that can be bent to expose or cover another one or more interface holes;
    wherein the flexible second cover member is latched to the base, and the flexible first cover member is latched to the base and the flexible second cover member.

8. The cover mechanism as claimed in claim 7, wherein the flexible first cover member is latched to the base so that the flexible first cover member is stopped from moving away from the base in a first direction, and the flexible first cover member is latched to the flexible second cover member so that the flexible first cover member is stopped from moving away from the base in a second direction.

9. The cover mechanism as claimed in claim 8, wherein the flexible first cover member further comprises a latching cutout, the base comprising a latching protrusion latched into the latching cutout.

10. The cover mechanism as claimed in claim 9, wherein the flexible second cover member further comprises a locking pin comprising a limiting portion and a pin portion;
    when the flexible second cover member is latched to the base and the flexible first cover member, the limiting portion resists against base and thus limits the flexible second cover member from moving in a first direction, and the pin portion engages through the first and second locking holes and thus limits the flexible second cover member from moving in a second direction.

11. The cover mechanism as claimed in claim 10, wherein the flexible first cover member is configured to be biased around the locking protrusion, and the flexible second cover member is configured to be biased around the locking pin.

12. The cover mechanism as claimed in claim 8, wherein:
the base comprises a locking block defining a first locking hole; and
the flexible first cover member further comprises a locking protrusion defining a second locking hole;
wherein when the flexible first cover member is latched to the base, the first locking hole aligns with the second locking hole, and the locking protrusion contacts the locking block.

13. The cover mechanism as claimed in claim 10, wherein:
the base further comprises a groove and a slit;
the flexible first cover member further comprises a first connecting portion connecting the locking portion to the flexible first cover portion, the connecting portion received in the groove;
the flexible second cover member further comprises a second connecting portion connecting the locking pin to the flexible second cover portion, the second connecting portion received in the slit.

14. A cover mechanism, comprising:
a base comprising a locking block;
a flexible first cover member securely locked to the base, comprising a locking protrusion and a first flexible part configured for being bended to be rotatable; and
a flexible second cover member securely locked to the base, comprising a second flexible part configured for being bended to be rotatable, and a locking pin configured for being locked by the locking block and locking the locking protrusion with the locking block.

15. The cover mechanism as claimed in claim 14, wherein the locking block comprises a first locking hole, the locking protrusion defining a second locking hole, the locking pin engaging through the first locking hole and second locking hole.

16. The cover mechanism as claimed in claim 15, wherein the first flexible part is rotatable relative to the locking protrusion, the second flexible part is rotatable relative to the locking pin.

* * * * *